(12) United States Patent
Nakura et al.

(10) Patent No.: US 6,249,157 B1
(45) Date of Patent: Jun. 19, 2001

(54) SYNCHRONOUS FREQUENCY DIVIDING CIRCUIT

(75) Inventors: Toru Nakura; Kimio Ueda, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/353,774

(22) Filed: Jul. 15, 1999

(30) Foreign Application Priority Data

Feb. 2, 1999 (JP) .................................................. 11-024868

(51) Int. Cl.$^7$ ...................................................... H03B 19/00
(52) U.S. Cl. ............................................. 327/117; 327/115
(58) Field of Search .................................... 327/141, 161, 327/162, 163, 115, 117; 377/47, 48

(56) References Cited

U.S. PATENT DOCUMENTS 4,656,649 * 4/1987 Takahashi ................................ 377/48
4,816,700 * 3/1989 Imel ....................................... 327/154
5,341,031 * 8/1994 Kinoshita et al. ..................... 327/259

FOREIGN PATENT DOCUMENTS 5-136691   6/1993   (JP) .

* cited by examiner

*Primary Examiner*—Toan Tran
*Assistant Examiner*—Linh Nguyen
(74) *Attorney, Agent, or Firm*—McDermott, Will & Emery

(57) ABSTRACT

First to third D flip-flops, fourth to sixth D flip-flops, and a delay circuit are provided. The first to third D flip-flops frequency-divide a clock signal. The fourth to sixth D flip-flops are provided corresponding to the first to third D flip-flops for latching frequency-divided outputs from corresponding D flip-flops and outputting them in synchronization with the clock signal. Accordingly, the frequency-divided outputs from the fourth to sixth D flip-flops are synchronized with the clock signal with a delay of prescribed time. The delay circuit outputs the clock signal after a delay of the prescribed time. Thus, the output of the delay circuit and the frequency-divided outputs are synchronized without delay.

8 Claims, 13 Drawing Sheets

SYNCHRONOUS FREQUENCY DIVIDING CIRCUIT

BACKGROUND OF THE INVENTION

1. Field of the Invention

The present invention relates to synchronous frequency dividing circuits and more particularly to a synchronous frequency dividing circuit for outputting frequency-divided signals in synchronization with a clock signal.

2. Description of the Background Art

The circuitry formed of connected multiple stages of delay type flip-flop circuits DFF01–DFF03 of which outputs are fed back to the inputs as shown in FIG. 23 is a typical frequency dividing circuit. Since flip-flop circuits DFF01–DFF03 each cause delay, signals f/2, f/4, f/8 which are divided by the circuits are delayed from a rise of a clock signal f by delays d1–d3 as shown in FIG. 24. Since divided signals f/2, f/4, f/8 drive different loads, delays d1–d3 are different from one another. Further, delays d1–d3 are varied according to an operating frequency and the logical state of a load. When a logic circuit is formed by utilizing clock signal f and divided signals f/2, f/4, f/8, a circuit for adjusting delays d1–d3 becomes complicated.

As a result, the number of transistors increases, which also increases power consumption.

In order to solve such problems, Japanese Patent Laying-Open No. 5-136691 discloses the frequency dividing circuit for latching divided signals f/2, f/4, f/8 by flip-flops DFF011–DFF013 and outputting divided signals f/2, f14, f/8 in synchronization with clock signal f as shown in FIG. 25.

In the frequency dividing circuit as shown in FIG. 25, however, divided signals f/2, f/4, f/8 are synchronized with clock signal f, exactly with a delay of time d4, as shown in FIG. 26. Further, divided signals f/2, f/4, f/8 are not in phase with one another.

SUMMARY OF THE INVENTION

The present invention was made to solve the problems above and its object is to provide a frequency dividing circuit for synchronizing divided signals with a clock signal without delay. Another object of the present invention is to provide a frequency dividing circuit in which divided signals are in phase with one another.

A frequency dividing circuit according to one aspect of the present invention includes a flip-flop circuit, a latch circuit, and a delay circuit. The flip-flop circuit divides a clock signal. The latch circuit latches a signal divided by the flip-flop circuit and outputs the signal in synchronization with the clock signal. The delay circuit delays the clock signal and outputs the clock signal in synchronization with the signal from the latch circuit.

In the frequency dividing circuit, delay is caused from the time when the latch circuit receives the clock signal to the time when the latch circuit outputs the signal divided by the flip-flop circuit. That is, the signal output from the latch circuit is in synchronization with the clock signal with a delay of prescribed time. The delay circuit delays the clock signal by the prescribed time for latch circuit delay. Thus, the clock signal delayed by the delay circuit and the signal divided by the flip-flop circuit are in synchronization with each other without delay.

A frequency dividing circuit according to another aspect of the present invention includes a first flip-flop circuit, a first latch circuit, a second flip-flop circuit, a third flip-flop circuit, and a second latch circuit. The first flip-flop circuit divides a clock signal. The first latch circuit latches a signal divided by the first flip-flop circuit and outputs the signal in synchronization with the clock signal. The second flip-flop circuit divides the signal from the first latch circuit. The third flip-flop circuit receives the signal from the second flip-flop circuit and outputs the signal in phase with the signal divided by the first flip-flop circuit. The second latch circuit latches the signal from the third flip-flop circuit and outputs the signal in synchronization with the clock signal.

In the frequency dividing circuit, the signal from the first flip-flop circuit is in phase with the signal from the third flip-flop circuit. The signals from the first and third flip-flop circuits are output in synchronization with the clock signal by the first and second latch circuits. Thus, the signals divided by the first and second flip-flop circuits are output in phase with each other.

A frequency dividing circuit according to still another aspect of the present invention includes a first flip-flop circuit, a first latch circuit, a second flip-flop circuit, and a second latch circuit. The first flip-flop circuit divides a clock signal. The first latch circuit latches a signal divided by the first flip-flop circuit and outputs the signal in synchronization with the clock signal. The second flip-flop circuit divides the signal from the first latch circuit. The second latch circuit latches the signal from the second flip-flop circuit and outputs the signal in synchronization with the signal from the first latch circuit.

In the frequency dividing circuit, the signal from the second latch circuit is synchronized with the signal from the first latch circuit. This is because the signal from the second flip-flop circuit has a lower frequency than the clock signal and therefore it does not always have to be synchronized with the clock signal. Accordingly, by using the signal from the first latch circuit to operate the second latch circuit, power consumption can be reduced as compared with a case where the clock signal is used.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
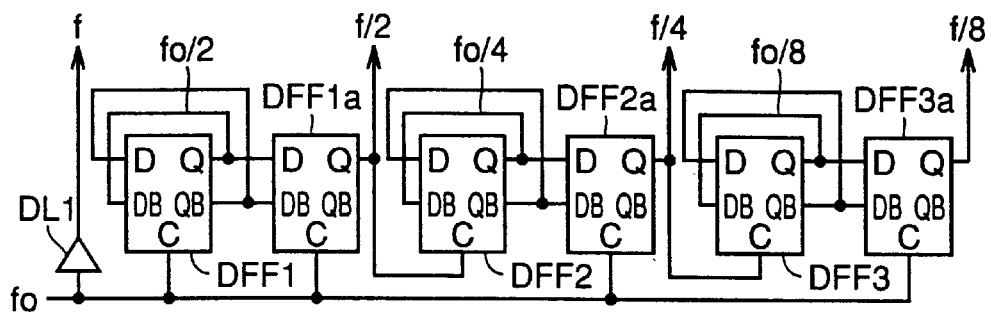
FIG. 1 is a block diagram showing a configuration of a frequency dividing circuit according to a first embodiment of the present invention.

The embodiments of the present invention will be described in detail below with respect to the drawings. The same or corresponding parts in the drawings have the same reference characters and their description will not be repeated.

First Embodiment

FIG. 1 is a block diagram showing an overall configuration of a frequency dividing circuit according to a first embodiment of the present invention. Referring to FIG. 1, the frequency dividing circuit includes delay type flip-flop circuits (hereinafter referred to as D flip-flops) DFF1–DFF3, DFF1a–DFF3a, and a delay circuit DL1. D flip-flops DFF1–DFF3, DFF1a–DFF3a are flip-flop circuits of the complementary input-complementary output type. D flip-flop DFF1 has its output signals Q, QB fed back to its inputs DB, D and its clock input C receiving a clock signal f0. D flip-flop DFF1 outputs, from the output Q, a signal f0/2 having a cycle twice as large as clock signal f0 in synchronization with clock signal f0.

D flip-flop DFF1a has its inputs D, DB connected to the outputs Q, QB of flip-flop DFF1 and its clock input C receiving clock signal f0. D flip-flop DFF1a receives signal f0/2 from flip-flop DFF1 at its input D, delays the received signal by one cycle of clock signal f0, and outputs the delayed signal as a signal f/2 from its output Q.

D flip-flop DFF2 has its output signals Q, QB fed back to its inputs DB, D and its clock input C receiving clock signal f0. D flip-flop DFF2 outputs, from its output Q, a signal f0/4 having a cycle twice as large as signal f/2 from D flip-flop DFF1a in synchronization with signal f/2.

D flip-flop DFF2a has its inputs D, DB connected to the outputs Q, QB of flip-flop DFF2 and its clock input C receiving clock signal f0. D flip-flop DFF2a receives signal f0/4 from flip-flop DFF2 at its input D, delays the received signal by one cycle of clock signal f0, and outputs the delayed signal as a signal f/4 from its output Q.

D flip-flop DFF3 has its output signals Q, QB fed back to its inputs DB, D and its clock input C receiving clock signal f0. D flip-flop DFF3 outputs, from its output Q, a signal f0/8 having a cycle twice as large as signal f/4 from D flip-flop DFF2a in synchronization with signal f/4.

D flip-flop DFF3a has its inputs D, DB connected to the outputs Q, QB of flip-flop DFF3 and its clock input C receiving clock signal f0. D flip-flop DFF3a receives signal f0/8 from flip-flop DFF3 at its input D, delays the received signal by one cycle of clock signal f0, and outputs the delayed signal as a signal f/8 from its output Q.

Delay circuit DL1 is formed of two stages of inverters, and it delays clock signal f0 by prescribed time d described below and outputs the delayed signal as clock signal f.

The operation of the frequency dividing circuit having such a configuration will be described with reference to FIG. 2.

Since each of flip-flops DFF1a–DFF3a itself causes delay, signals f/2, f/4, f/8 are synchronized with clock signal f0 with a delay of time d. In the first embodiment, delay circuit DL1 is provided to delay clock signal f0 by time d and output the delayed signal as clock signal f. Thus, signals f/2, f/4, f/8 from flip-flops DFF1a–DFF3a and clock signal f can be output in full synchronization without delay.

Although the D flip-flops here are of the complementary input-complementary output type, all types of D flip-flops, for example, of the single input-complementary output type, the complementary input-single output type, the single input-single output type and the like may be used.

Further, T flip-flops may be used instead of D flip-flops DFF1–DFF3.

Although two stages of inverters are used as delay circuit DL1 for delaying clock signal f0 by time d, another delay circuit may be used instead.

Variation of First Embodiment

Figure 3:
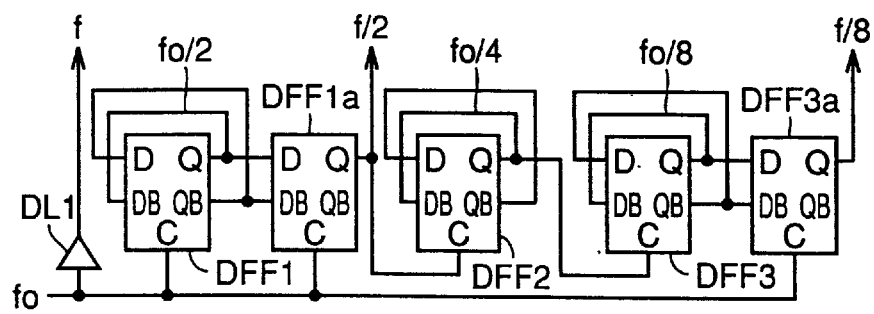
FIG. 3 is a block diagram showing a configuration of a variation of the frequency dividing circuit according to the first embodiment.

FIG. 3 is a block diagram showing an overall configuration of a variation of the frequency dividing circuit according to the first embodiment. Referring to FIG. 3, the frequency dividing circuit is formed by removing D flip-flop DFF2a from the frequency dividing circuit shown in FIG. 1 and using signal f0/4 from output Q of D flip-flop DFF2 for clock input C of D flip-flop DFF3.

Figure 4:
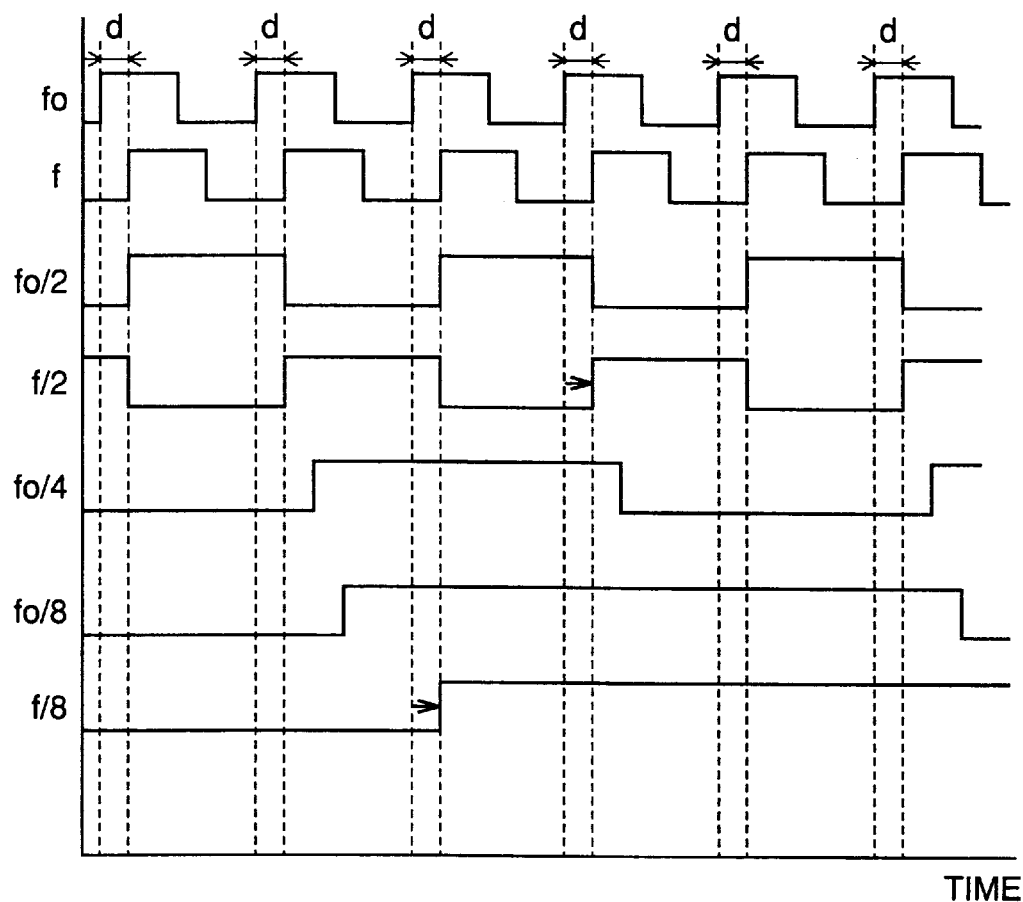
FIG. 4 is a timing chart of the frequency dividing circuit shown in FIG. 3.

If the signals divided by D flip-flops DFF1–DFF3 include a signal at a non-used frequency (here, signal f/4), the signal does not have to be synchronized with clock signal f0. If signal f0/4 from output Q of D flip-flop DFF2 is directly used as the clock input of D flip-flop DFF3 at the next stage, transistors necessary to form the frequency dividing circuit can be reduced, which can reduce the entire power consumption. Even in this case, signals f/2, f/8 from flip-flops DFF1a, DFF3a and clock signal f can of course be output without delay and in full synchronization as shown in FIG. 4. At this time, however, the delay between output Q of D flip-flop DFF1a and output Q of D flip-flop DFF3a (between f/2 and f/8 in FIG. 3) has to be smaller than one cycle of clock signal f0.

Second Embodiment

Figure 5:
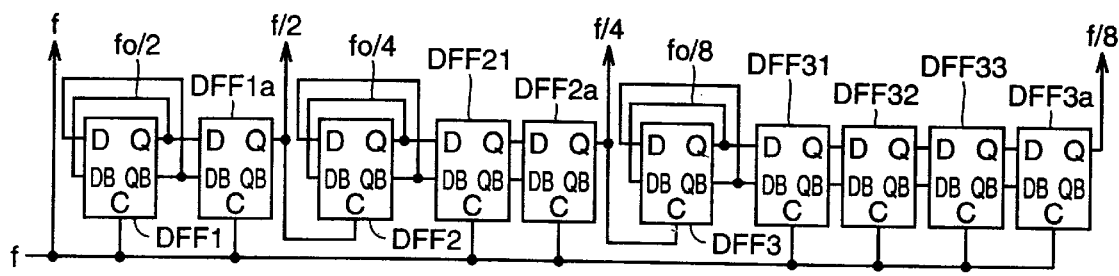
FIG. 5 is a block diagram showing a configuration of a frequency dividing circuit according to a second embodiment of the present invention.

FIG. 5 is a block diagram showing an overall configuration of a frequency dividing circuit according to a second embodiment of the present invention. Referring to FIG. 3, the frequency dividing circuit is formed by removing delay circuit DL1 from the frequency dividing circuit shown in FIG. 1 and newly providing D flip-flops DFF21, DFF31–DFF33. D flip-flop DFF21 receives outputs Q, QB of D flip-flop DFF2 at its inputs D, DB, delays the received outputs by one cycle of clock signal f, and outputs them from its outputs Q, QB in synchronization with clock signal f. D flip-flop DFF31 receives outputs Q, QB of D flip-flop DFF3 at its inputs D, DB, delays the received outputs by one cycle of clock signal f, and output them from its outputs Q, QB in synchronization with clock signal f. D flip-flop DFF32 receives outputs Q, QB of D flip-flop DFF31 at its inputs D, DB, delays the received outputs by one cycle of clock signal f, and outputs them from its outputs Q, QB in synchronization with clock signal f. D flip-flop DFF33 receives outputs Q, QB of D flip-flop DFF32 at its inputs D, DB, delays the received outputs by one cycle of clock signal f, and outputs them from its outputs Q, QB in synchronization with clock signal f D flip-flop DFF2a receives outputs Q, QB of flip-flop DFF21 at its inputs D, DB, and outputs signal f/4 from its output Q in synchronization with clock signal f. D flip-flop DFF3a receives outputs Q, QB of flip-flop DFF33 at its inputs D, DB, and outputs signal f/8 from its output Q in synchronization with clock signal f.

Figure 6:
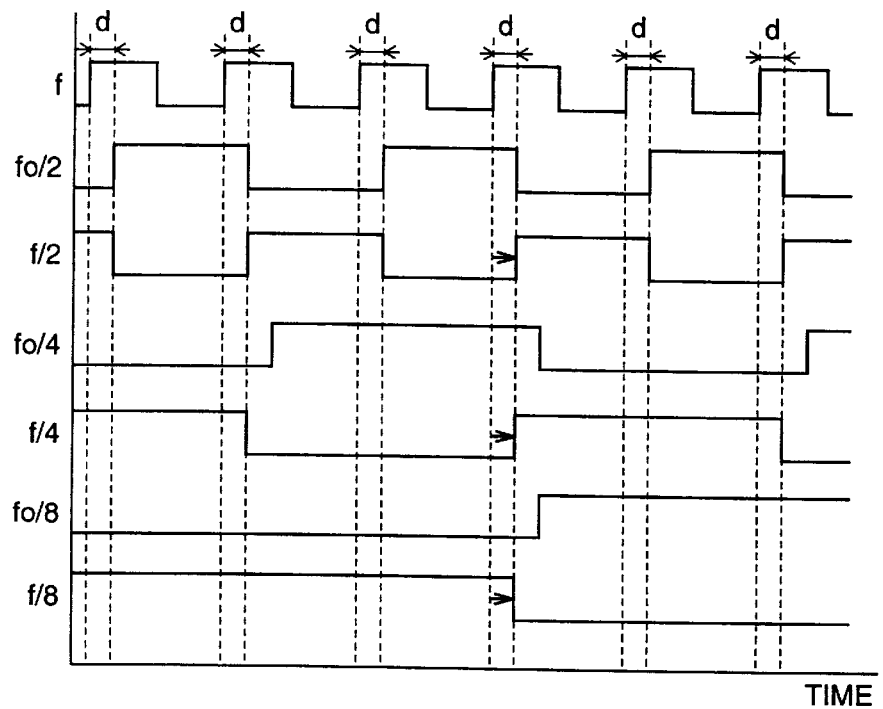
FIG. 6 is a timing chart of the frequency dividing circuit shown in FIG. 5.

The operation of the frequency dividing circuit having such a configuration will be described below with reference to FIG. 6.

Figure 2:
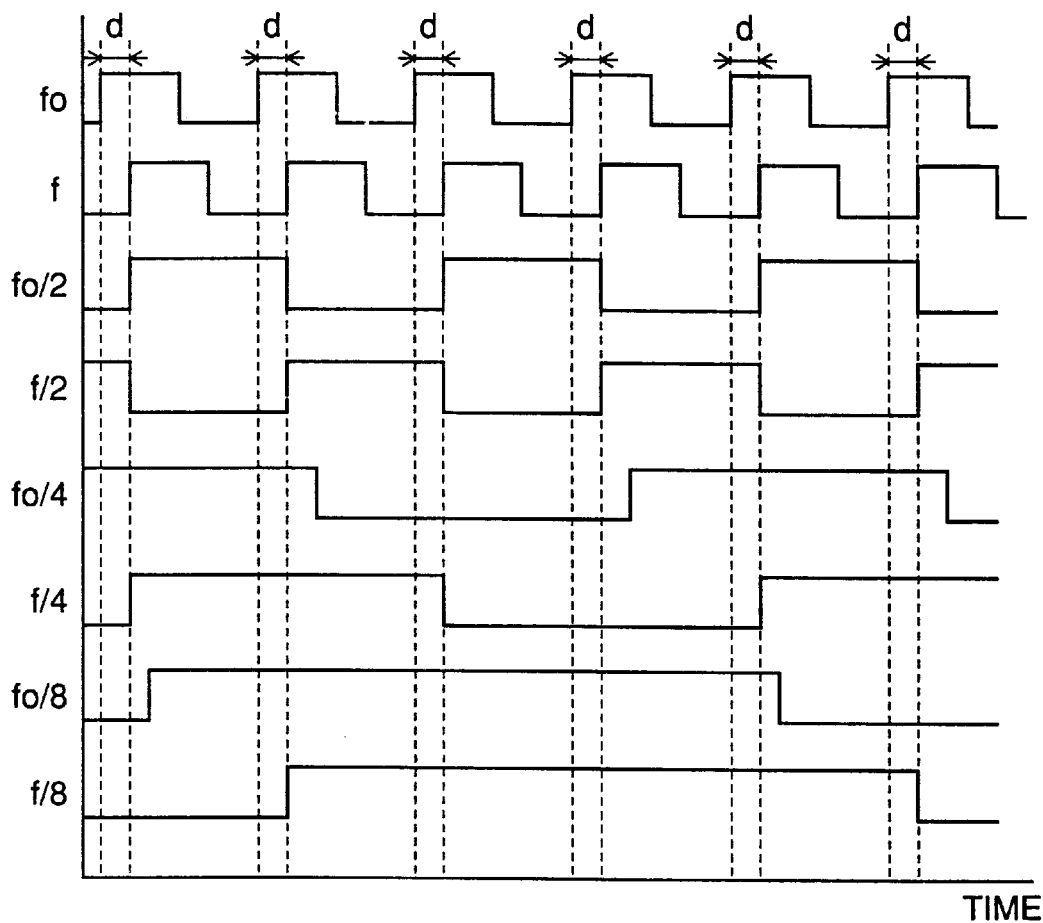
FIG. 2 is a timing chart of the frequency dividing circuit shown in FIG. 1.

In the frequency dividing circuits shown in FIGS. 1 and 2, frequency-divided signals f/2, f/4, f/8 are not in phase with one another. For example, signal f/4 does not change at a rise of signal f/2, and signal f/8 does not change at a rise of signal f/4.

In the frequency dividing circuit according to the second embodiment, signal f0/4 is delayed by one cycle of clock signal f by D flip-flop DFF21 before it is output to D flip-flop DFF2a, and signal f0/4 is delayed by three cycles of clock signal f by D flip-flops DFF31–DFF33 before it is output to D flip-flop DFF3a. Accordingly, signals f/2, f/4, f/8 can all be operated in phase with one another as shown in FIG. 6.

Although the D flip-flops here are of the complementary input-complementary output type, all types of D flip-flops, for example, of the single input-complementary output type, the complementary input-single output type, the single input-single output type and the like may also be used.

Further, T flip-flops may be used instead of D flip-flops DFF1–DFF3.

Third Embodiment

Figure 7:
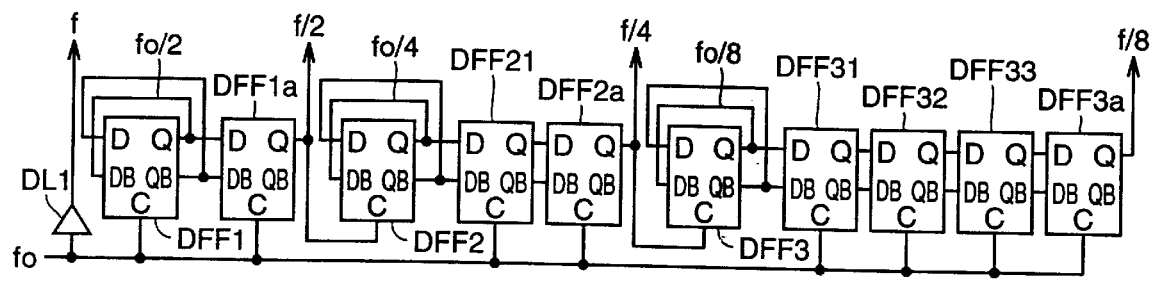
FIG. 7 is a block diagram showing a configuration of a frequency dividing circuit according to a third embodiment of the present invention.

FIG. 7 is a block diagram showing an overall configuration of a frequency dividing circuit according to a third embodiment of the present invention. Referring to FIG. 7, the frequency dividing circuit is formed by adding delay circuit DL1 shown in FIG. 1 to the frequency dividing circuit shown in FIG. 5.

Figure 8:
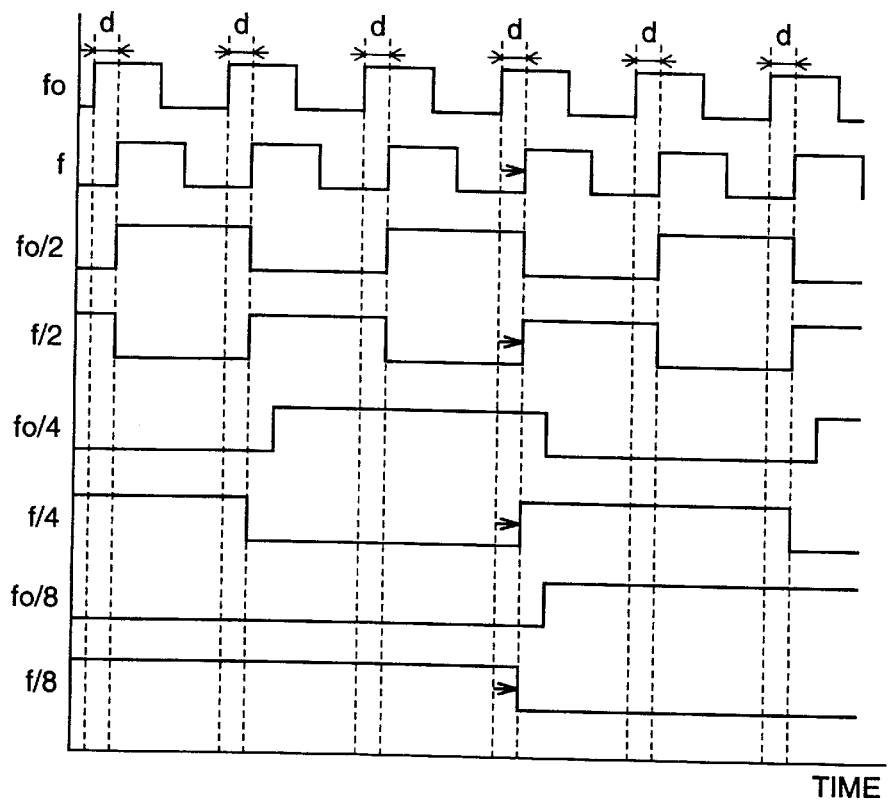
FIG. 8 is a timing chart of the frequency dividing circuit shown in FIG. 7.

Accordingly, clock signal f, signals f/2, f/4, f/8 can all be operated in phase with one another as shown in FIG. 8.

Although the D flip-flops here are of the complementary input-complementary output type, all types of D flip-flops, for example, of the single input-complementary output type, the complementary input-single output type, the single input-single output type and the like may also be used.

Further, T flip-flops may be used instead of D flip-flops DFF1–DFF3.

Although two stages of inverters are used as a delay circuit for delaying clock signal f0 by time d, another delay circuit may be used instead.

Variation of Second Embodiment

Figure 9:
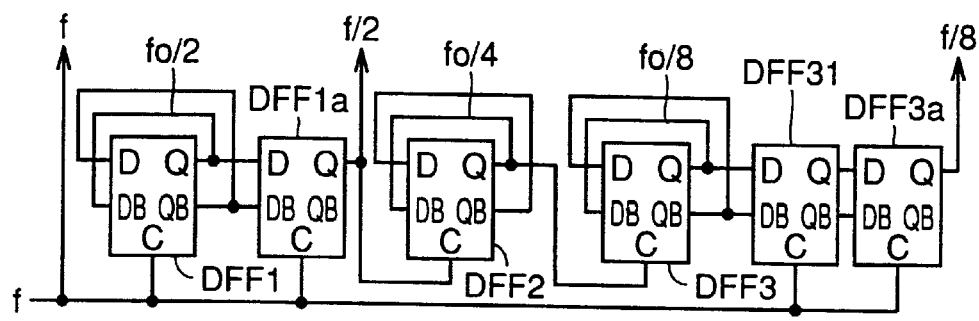
FIG. 9 is a block diagram showing a configuration of a variation of the frequency dividing circuit according to the second embodiment.

FIG. 9 is a block diagram showing an overall configuration of a variation of the frequency dividing circuit according to the second embodiment. Referring to FIG. 9, the frequency dividing circuit is formed by removing D flip-flops DFF21, DFF2a, DFF32, DFF33 from the frequency dividing circuit shown in FIG. 5. It is assumed here that the signals which are frequency-divided by D flip-flops DFF1–DFF3 include a signal at a non-used frequency (here, signal f/4) as described in the third embodiment.

Figure 10:
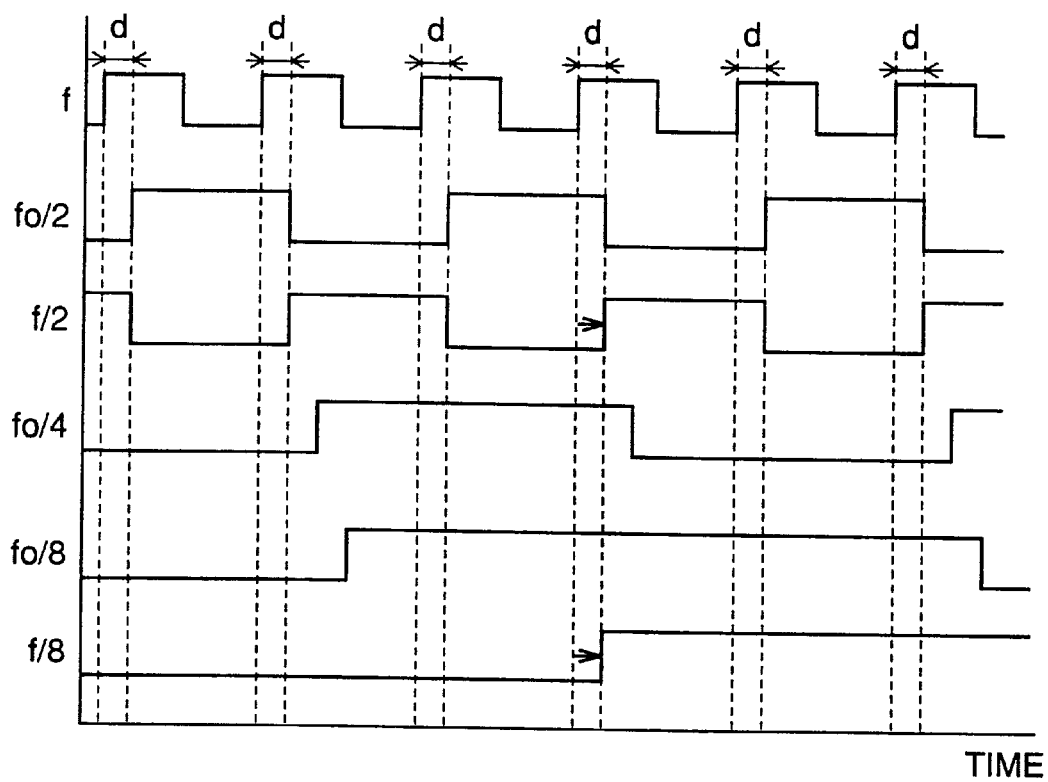
FIG. 10 is a timing chart of the frequency dividing circuit shown in FIG. 9.

Accordingly, transistors necessary to form the frequency dividing circuit can be reduced, which can reduce the entire power consumption. Even in this case, signals f/2, f/8 from flip-flops DFF1a, DFF3a can of course be output in full synchronization as shown in FIG. 10. At this time, however, the delay between output Q of D flip-flop DFF1a and output Q of D flip-flop DFF3a (between f/2 and f/8 in FIG. 9) has to be smaller than one cycle of clock signal f.

Variation of Third Embodiment

Figure 11:
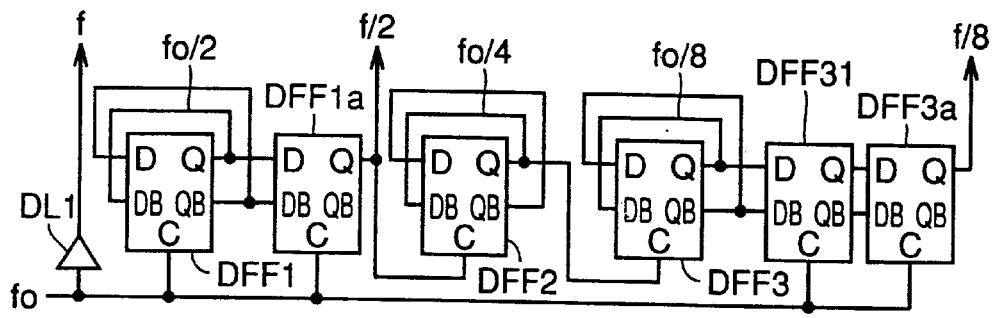
FIG. 11 is a block diagram showing a configuration of a variation of the frequency dividing circuit according to the third embodiment.

FIG. 11 is a block diagram showing an overall configuration of a variation of the frequency dividing circuit according to the third embodiment. Referring to FIG. 11, the frequency dividing circuit is formed by adding delay circuit DL1 similar to the one shown in FIG. 1 to the frequency dividing circuit shown in FIG. 9.

Figure 12:
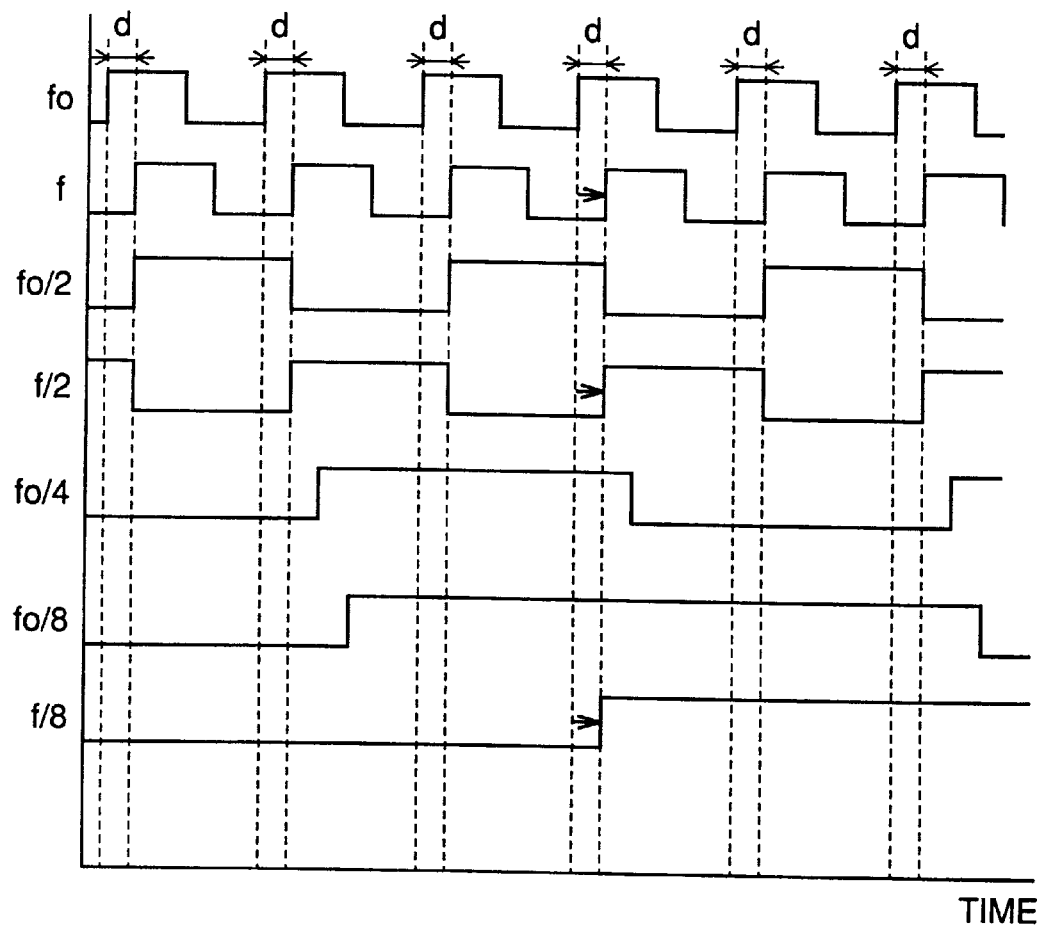
FIG. 12 is a timing chart of the frequency dividing circuit shown in FIG. 11.

Accordingly, clock signal f, signals f/2, f/8 can all be operated in phase with one another as shown in FIG. 12.

Fourth Embodiment

Figure 13:
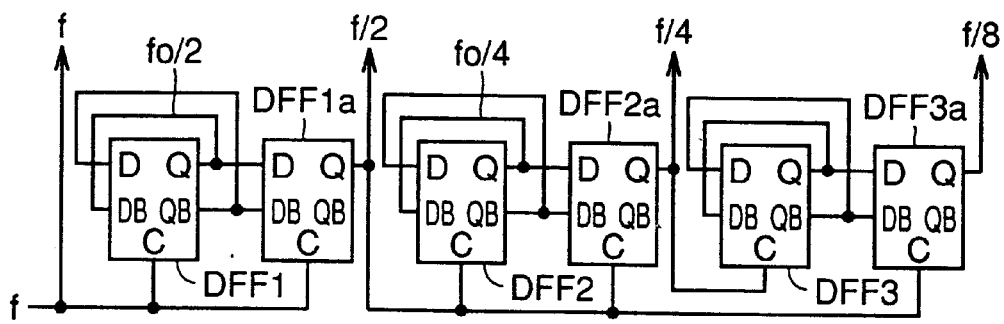
FIG. 13 is a block diagram showing a configuration of a frequency dividing circuit according to a fourth embodiment of the present invention.

FIG. 13 is a block diagram showing an overall configuration of a frequency dividing circuit according to a fourth embodiment of the present invention. Referring to FIG. 13, the frequency dividing circuit is formed by removing delay circuit DL1 from the frequency dividing circuit shown in FIG. 1 and using signal f/2 from D flip-flop DFF1a for clock inputs C of D flip-flops DFF2, DFF2a, DFF3a. D flip-flop DFF2a receives signal f/2 from D flip-flop DFF1a at its clock input C and, in response, outputs signal f/4 from its output Q. D flip-flop DFF3a receives signal f/2 from D flip-flop DFF1a and, in response, outputs signal f/8 from its output Q.

Figure 14:
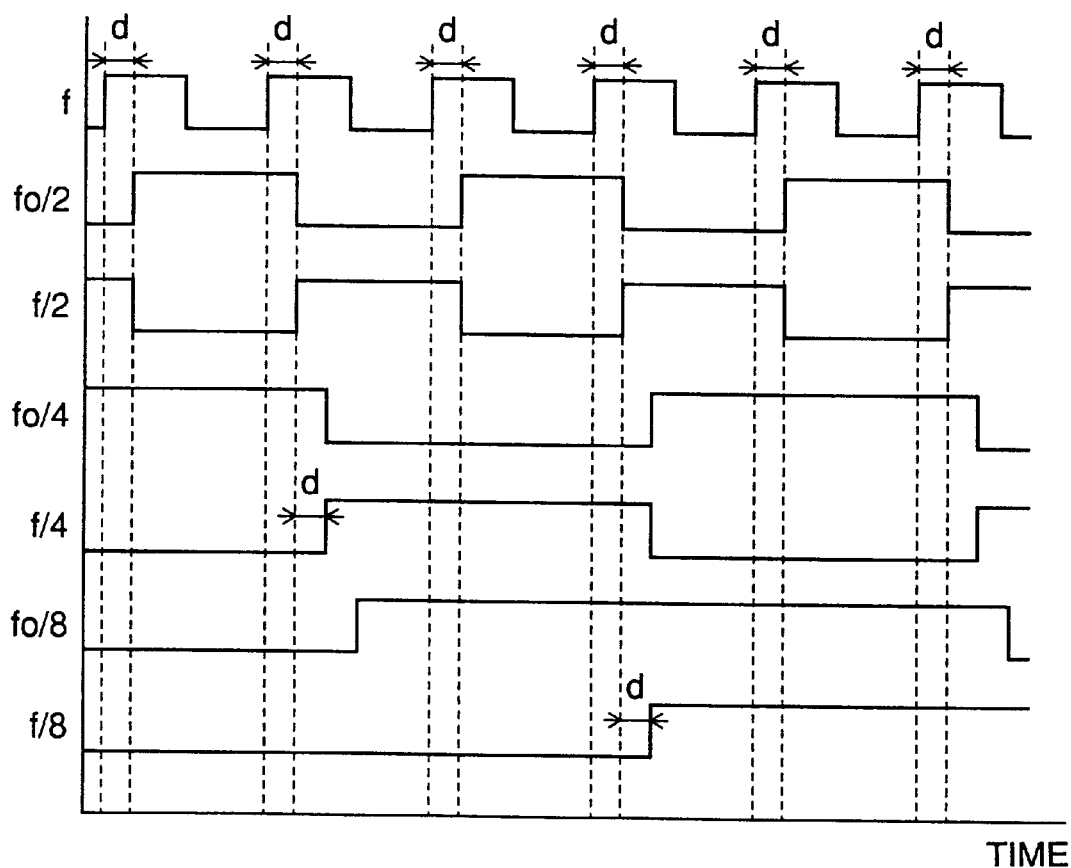
FIG. 14 is a timing chart of the frequency dividing circuit shown in FIG. 13.

In the frequency dividing circuit, signal f/2 is synchronized with clock signal f with a delay of time d and signals f/4, f/8 are synchronized with signal f/2 with a delay of time d as shown in FIG. 14. That is, signals f/4, f/8 are delayed by time 2d from clock signal f.

However, signals f/4, f/8 have relatively low frequencies, and the portions utilizing these signals have a margin of the operating speed. Even if delay d of one stage of a D flip-flop is added, the operation is often not influenced.

In the frequency dividing circuit, therefore, D flip-flops DFF2a, DFF3a are operated using signal f/2 to reduce power consumption.

Although the D flip-flops here are of the complementary input-complementary output type, all types of D flip-flops, for example, of the single input-complementary output type, the complementary input-single output type, the single input-single output type and the like may also be used instead.

Further, T flip-flops may be used instead of D flip-flops DFF1–DFF3.

Fifth Embodiment

Figure 15:
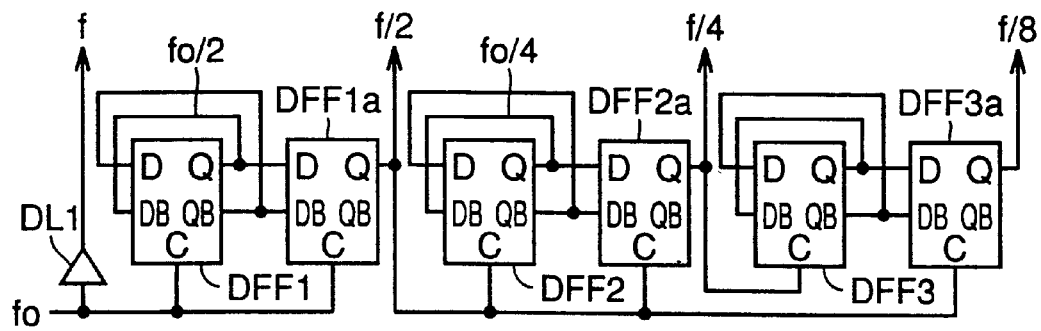
FIG. 15 is a block diagram showing a configuration of a frequency dividing circuit according to a fifth embodiment of the present invention.

FIG. 15 is a block diagram showing an overall configuration of a frequency dividing circuit according to a fifth embodiment of the present invention. Referring to FIG. 15, the frequency dividing circuit is formed by adding delay circuit DL1 to the frequency dividing circuit shown in FIG. 13.

Figure 16:
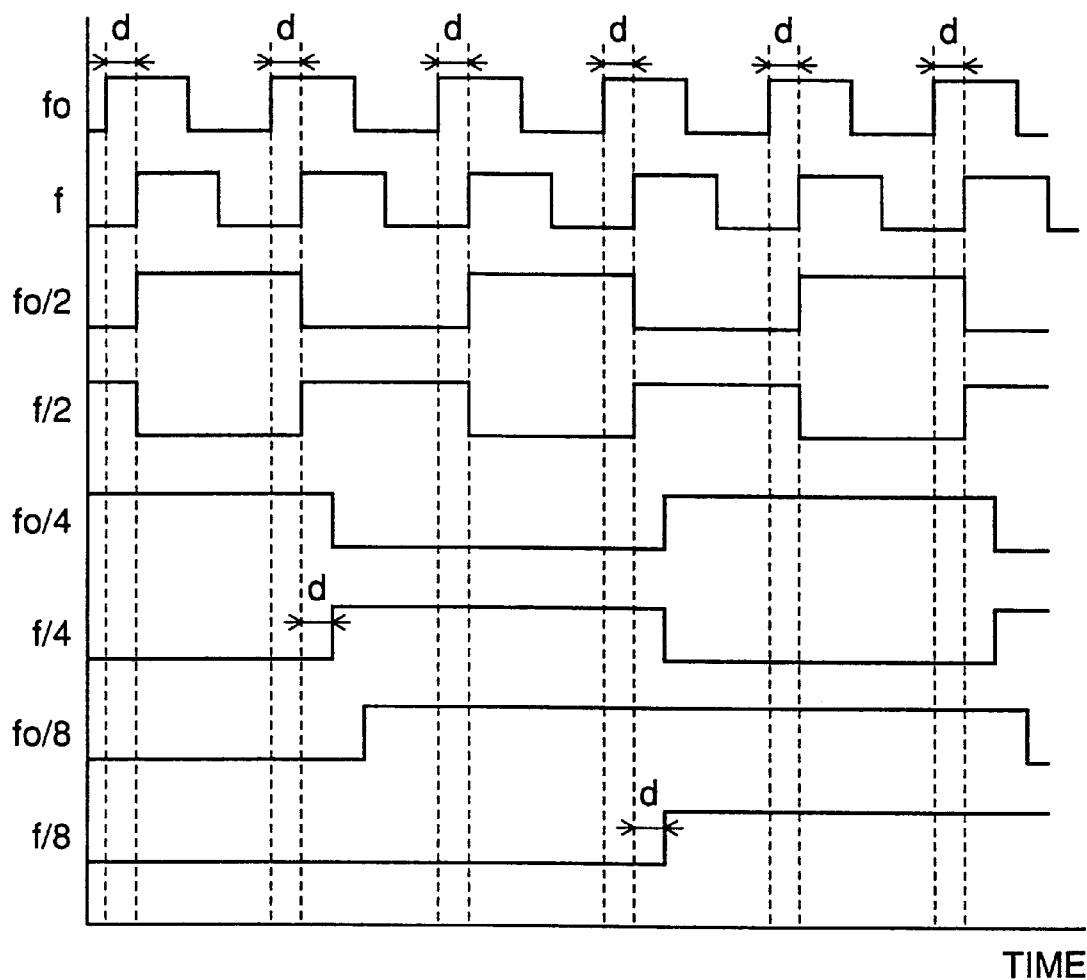
FIG. 16 is a timing chart of the frequency dividing circuit shown in FIG. 15.

Accordingly, signal f/2 is synchronized with clock signal f without delay and signals f/4, f/8 are synchronized with clock signal f with a delay of time d as shown in FIG. 16.

Although the D flip-flops here are of the complementary input-complementary output type, all types of D flip-flops, for example, of the single input-complementary output type, the complementary input-single output type, the single input-single output type and the like may also be used instead.

Further, T flip-flops may be used instead of D flip-flops DFF1–DFF3.

Although two stages of inverters are used as delay circuit DL1 for delaying clock signal f0 by time d, another delay circuit may be used instead.

Sixth Embodiment

Figure 17:
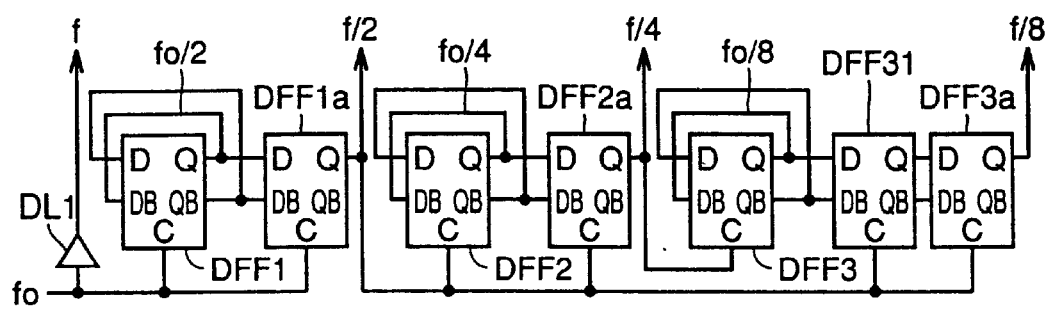
FIG. 17 is a block diagram showing a configuration of a frequency dividing circuit according to a sixth embodiment of the present invention.

FIG. 17 is a block diagram showing an overall configuration of a frequency dividing circuit according to a sixth embodiment of the present invention. Referring to FIG. 17, the frequency dividing circuit is formed by adding D flip-flop DFF31 to the frequency dividing circuit shown in FIG. 15. D flip-flop DFF31 receives outputs Q, QB of D flip-flop DFF3 at its inputs D, DB, delays the received outputs by one cycle of signal f/2, and outputs them from its outputs Q, QB in synchronization with clock signal f/2.

Figure 18:
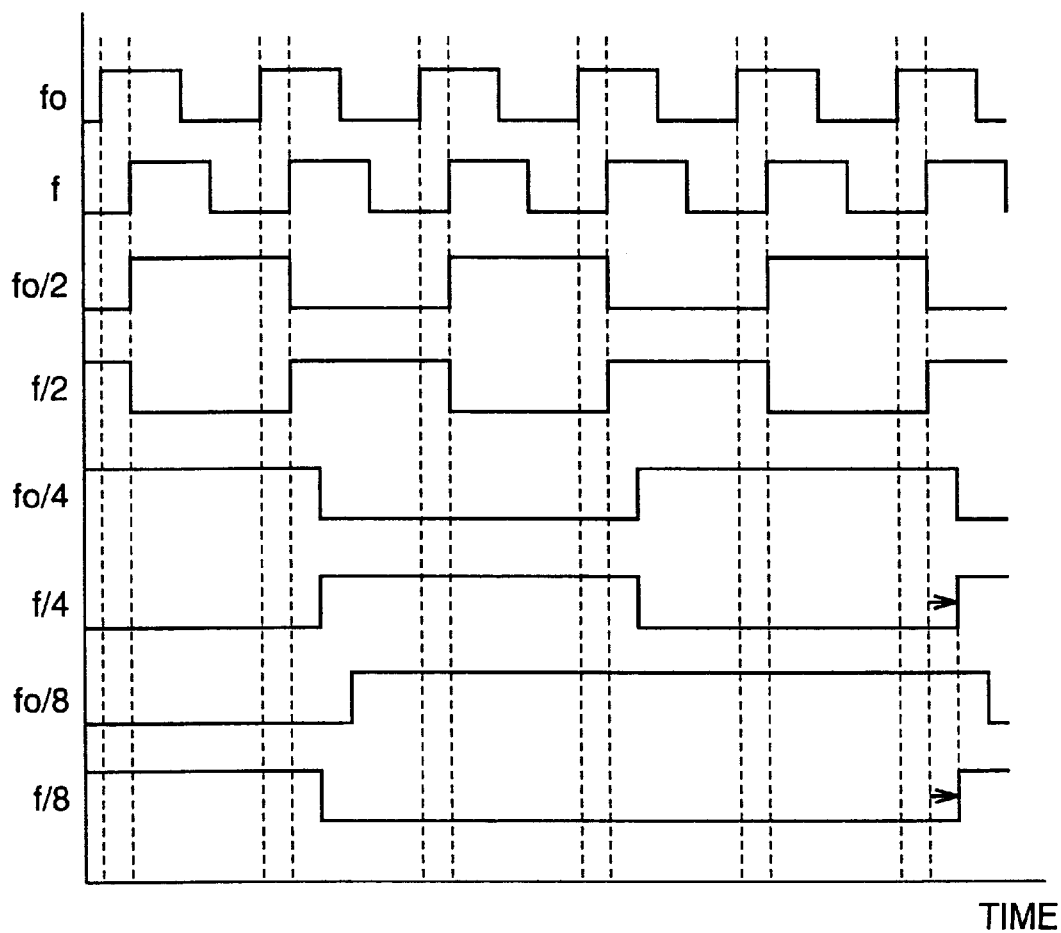
FIG. 18 is a timing chart of the frequency dividing circuit shown in FIG. 17.

The operation of the frequency dividing circuit having such a configuration will be described below with reference to FIG. 18.

In the frequency dividing circuit shown in FIG. 15, signal f/8 does not change at a rise of signal f/4. In the sixth embodiment, however, signals f/4, f/8 can be operated in phase with each other as shown in FIG. 18 by delaying signal f0/8 by one cycle of signal f/2 using D flip-flop DFF31.

Although the D flip-flops here are of the complementary input-complementary output type, all types of D flip-flops, for example, of the single input-complementary output type, the complementary input-single output type, the single input-single output type and the like may be used instead.

Further, T flip-flops may be used instead of D flip-flops DFF1–DFF3.

Although two stages of inverters are used as delay circuit DL1 for delaying clock signal f0 by time d, another delay circuit may be used instead.

First Variation of Fourth Embodiment

Figure 19:
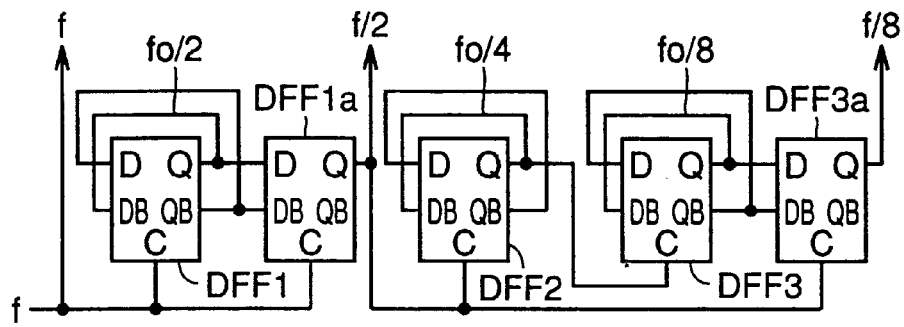
FIG. 19 is a block diagram showing a configuration of a first variation of the frequency dividing circuit according to the fourth embodiment.

FIG. 19 is a block diagram showing an overall configuration of a first variation of the frequency dividing circuit according to the fourth embodiment. Referring to FIG. 19, the frequency dividing circuit is formed by removing D flip-flop DFF2a from the frequency dividing circuit shown in FIG. 13. It is assumed here that the signals divided by D flip-flops DFF1–DFF3 include a signal at a non-used frequency (here, signal f/4) similarly to the third embodiment.

Figure 20:
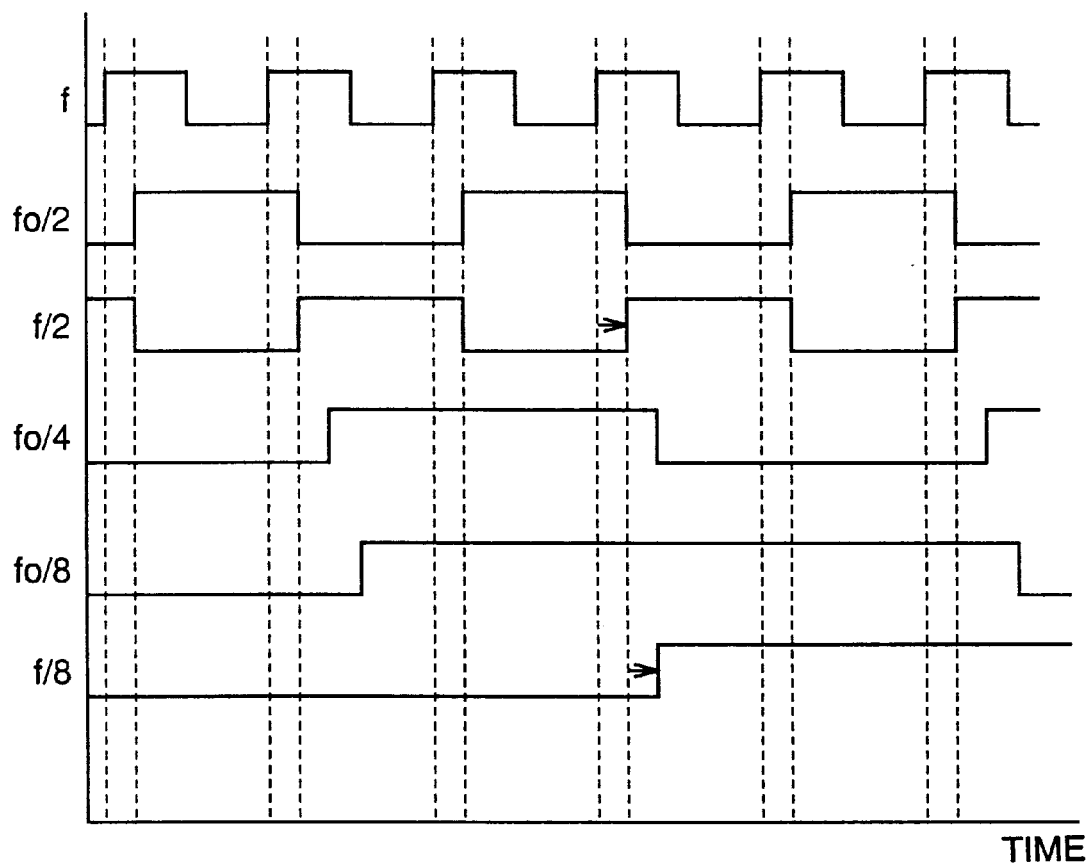
FIG. 20 is a timing chart of frequency dividing circuit shown in FIG. 19.

Accordingly, transistors necessary to form the frequency dividing circuit can be reduced, which can reduce the entire power consumption. Even in this case, signal f/2 is synchronized with clock signal f with a delay of time d and signal f/8 is synchronized with signal f/2 with a delay of time d as shown in FIG. 20. At this time, however, the delay between output Q of D flip-flop DFF1a and output Q of D flip-flop DFF3a (between f/2 and f/8 in FIG. 19) has only to be smaller than one cycle of signal f/2 rather than one cycle of clock signal f.

Second Variation of Fourth Embodiment

Figure 21:
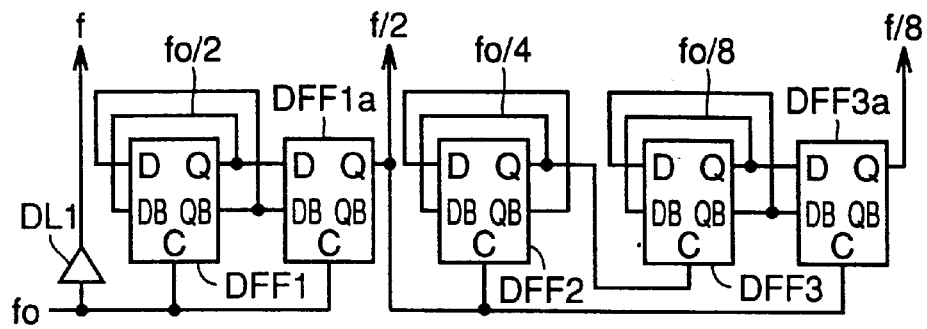
FIG. 21 is a block diagram showing a configuration of a second variation of the frequency dividing circuit according to the fourth embodiment.

FIG. 21 is a block diagram showing an overall configuration of a second variation of the frequency dividing circuit according to the fourth embodiment. Referring to FIG. 21, the frequency dividing circuit is formed by adding delay circuit DL1 to the frequency dividing circuit shown in FIG. 19.

Figure 22:
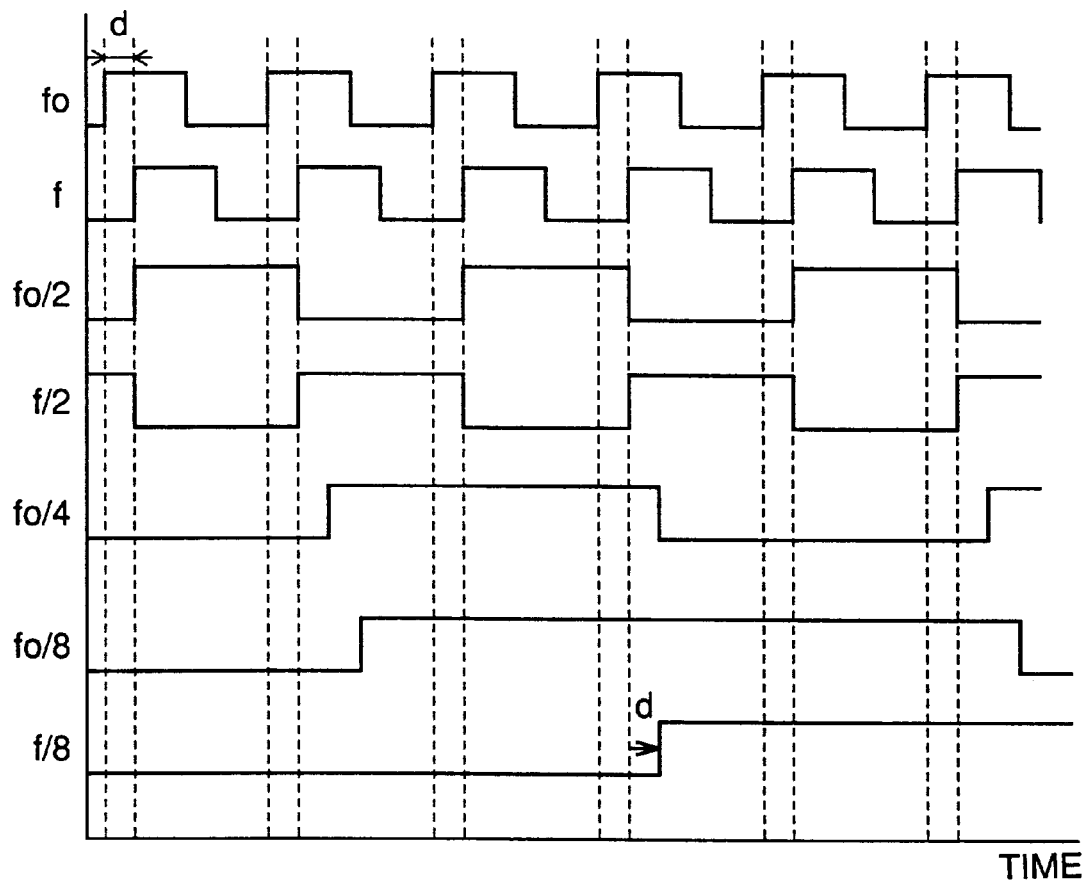
FIG. 22 is a timing chart of the frequency dividing circuit shown in FIG. 21.
Figure 23:
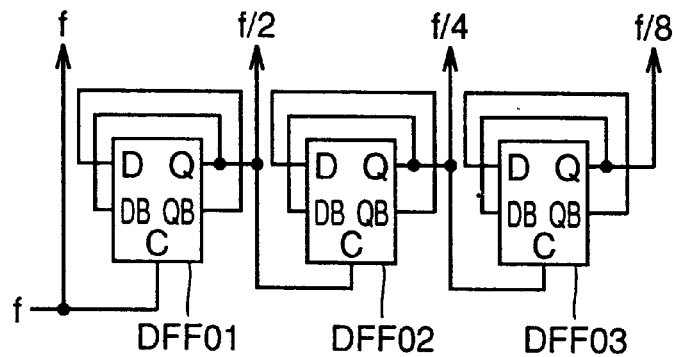
FIG. 23 is a block diagram showing a configuration of a conventional typical frequency dividing circuit.
Figure 24:
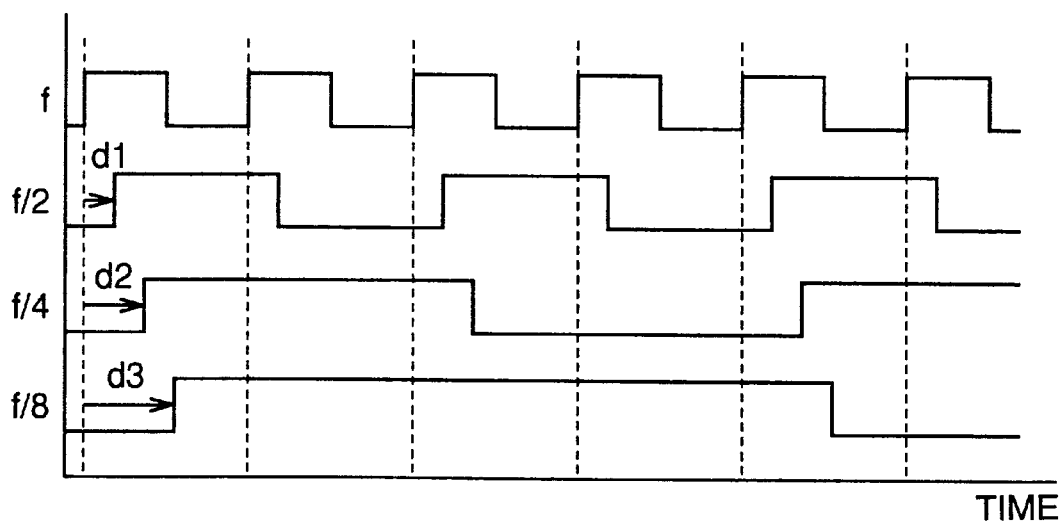
FIG. 24 is a timing chart of the frequency dividing circuit shown in FIG. 23.
Figure 25:
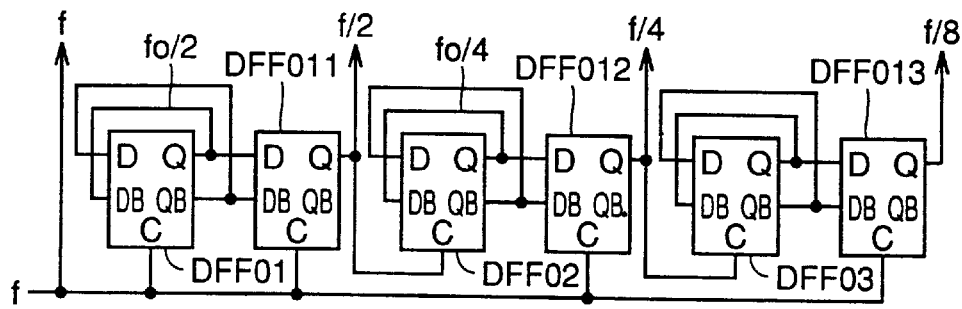
FIG. 25 is a block diagram showing a configuration of a frequency dividing circuit for outputting each frequency-divided output in synchronization with a clock signal.
Figure 26:
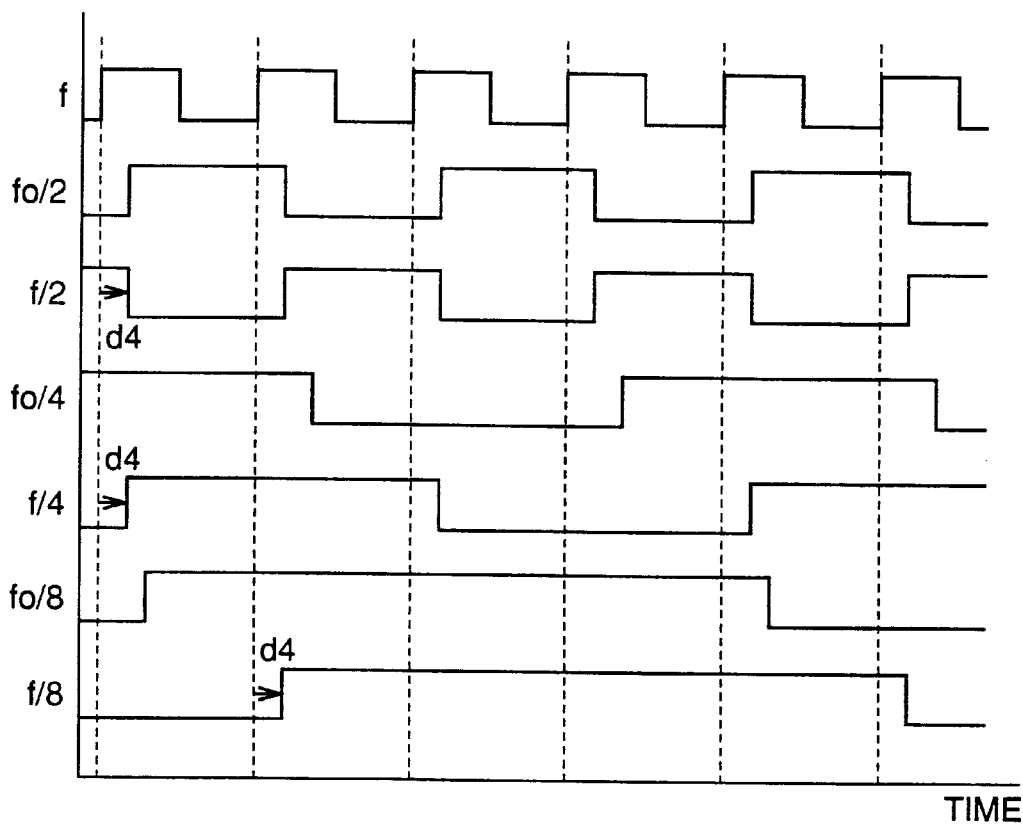
FIG. 26 is a timing chart of the frequency dividing circuit shown in FIG. 25.

Accordingly, signal f/2 is synchronized with clock signal f without delay and signal f/8 is synchronized with clock signal f with a delay of time d as shown in FIG. 22. It is therefore advantageous that, although signals f/8 and thereafter are delayed from clock signal f by time d, the outputs of frequency-divided outputs are fully matched at the portions requiring the highest speed of circuit operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency dividing circuit, comprising:
   a first flip-flop circuit dividing a clock signal;
   a first latch circuit latching a signal divided by said first flip-flop circuit and synchronizing the latched signal with said clock signal;
   a second flip-flop circuit dividing the signal from said first latch circuit;
   a first delay circuit delaying the signal from said second flip-flop circuit; and
   a second latch circuit latching the signal from said first delay circuit and making a phase of the latched signal coincident with a phase of the signal from said first latch circuit.

2. The frequency dividing circuit according to claim 1, further comprising:
   a second delay circuit delaying said clock signal to make a phase of said clock signal coincident with a phase of the signal from said first latch circuit.

3. A frequency dividing circuit, comprising:
   a first flip-flop circuit dividing a clock signal;
   a first latch circuit latching a signal divided by said first flip-flop circuit and synchronizing the latched signal with said clock signal;
   a second flip-flop circuit dividing the signal from said first latch circuit;
   a second latch circuit latching the signal from said second flip-flop circuit and synchronizing the latched signal with the signal from said first latch circuit;
   a third flip-flop circuit dividing the signal from said second latch circuit;
   a second delay circuit delaying the signal from said third flip-flop circuit; and
   a third latch circuit latching the signal from said second delay circuit and making a phase of the latched signal coincident with a phase of the signal from said second latch circuit.

4. The frequency dividing circuit according to claim 3, further comprising:
a first delay circuit delaying said clock signal to make a phase of said clock signal coincident with a phase of the signal from said first latch circuit.

5. A frequency dividing circuit comprising:
a first flip-flop circuit receiving a first clock signal and dividing the first clock signal to output a second clock signal;
a second flip-flop circuit receiving the second clock signal and dividing the second clock signal to output a third clock signal, and
a third flip-flop circuit receiving the first and third clock signals and holding the third clock signal in synchronism with the first clock signal.

6. A frequency dividing circuit comprising:
a first flip-flop circuit receiving a first clock signal and dividing the first clock signal to output a second clock signal;
a delay circuit delaying the second clock signal from said first flip-flop circuit; and
a second flip-flop circuit receiving the second clock signal from said delay circuit and a third clock signal, and holding the second signal in synchronism with the third clock signal, wherein said first clock signal is a clock signal obtained by frequency-dividing the third clock signal by $2^n$ (n is an integer equal to or greater than one).

7. The frequency dividing circuit according to claim 6, wherein
said delay circuit includes at least one flip-flop circuit receiving the second clock signal from said first flip-flop circuit and the third clock signal, and holding the second clock signal in synchronism with the third clock signal.

8. The frequency dividing circuit according to claim 1, wherein said first delay circuit includes a flip-flop circuit receiving the clock signal and the signal from said second flip-flop circuit, and holding the signal from said second flip-flop circuit in synchronism with the clock signal.

* * * * *